United States Patent [19]
Krone

[11] Patent Number: 6,118,399
[45] Date of Patent: Sep. 12, 2000

[54] COARSE/FINE SWITCHING ON DIGITAL-TO-ANALOG CONVERSION OUTPUT

[75] Inventor: Andrew W. Krone, Austin, Tex.

[73] Assignee: Silicon Laboratories, Inc., Austin, Tex.

[21] Appl. No.: 09/050,590

[22] Filed: Mar. 30, 1998

[51] Int. Cl.[7] ...................................................... H03M 1/68
[52] U.S. Cl. ............................................ 341/150; 341/145
[58] Field of Search .................................... 341/145, 154, 341/134, 144, 153

[56] References Cited

U.S. PATENT DOCUMENTS

| | | |
|---|---|---|
| 3,596,267 | 7/1971 | Goodman . |
| 3,654,560 | 4/1972 | Cath et al. . |
| 3,784,922 | 1/1974 | Blahut . |
| 4,720,688 | 1/1988 | Hasegawa et al. . |
| 4,724,420 | 2/1988 | Woodward ............................. 341/145 |
| 4,851,841 | 7/1989 | Sooch . |
| 4,876,544 | 10/1989 | Kuraishi . |
| 4,888,587 | 12/1989 | Kuraishi . |
| 4,980,899 | 12/1990 | Troost et al. . |
| 5,012,244 | 4/1991 | Wellard et al. . |
| 5,272,451 | 12/1993 | Yamate et al. . |
| 5,644,257 | 7/1997 | Kerth et al. . |
| 5,663,728 | 9/1997 | Essenwanger .......................... 341/145 |
| 5,856,766 | 1/1999 | Gillig et al. . |
| 5,870,046 | 2/1999 | Scott et al. . |
| 5,907,299 | 5/1999 | Green et al. . |

OTHER PUBLICATIONS

James C. Candy and Gabor C. Temes, "Oversampling Methods for A/D and D/A Conversion," IEEE Press, ISBN 0–87942–285–8, 1992, pp. 1–25.

D.R. Welland, B.P. Del Signore, and E.J. Swanson, and T. Tanaka, K. Hamashita, S. Hara, and K. Takasuka, "A Stereo 16–Bit Delta—Sigma A/D Converter for Digital Audio", Journal of the Audio Engineering Society, vol. 37, Jun. 1989, pp. 476–486.

Kirk C.–H Chao, Shujaat Nadeem, Wai L. Lee and Charles G. Sodini, "A Higher Order Topology for Interpolative Modulators for Oversampling A/D Converters", IEEE Trans. Circuits and Sys., vol. CAS–37, Mar. 1990, pp. 309–318.

James C. Candy, "A Use of Double Integration in Sigma Delta Modulation", IEEE Trans. Commun., vol. COM–33, Mar. 1985, pp. 249–258.

Paul R. Gray and Rinaldo Castello, "Chapter 10—Performance Limitations in Switched–Capacitor Filters", Design of MOS VLSI Circuits for Telecommunications—1985 Prentice–Hall, Englewood Cliffs, NY 07632, ISBN: 0–13–200643–X, pp. 314–333.

Adel S. Sedra, "Chapter 9—Switched–Capacitor Filter Synthesis", Design of MOS VLSI Circuits for Telecommunications—1985 Prentice–Hall, Inc., Englewood Cliffs, NJ 07632, ISBN: 0–13–200643–X, pp. 272–313.

*Primary Examiner*—Brian Young
*Attorney, Agent, or Firm*—Davis & Johnson, LLP

[57] ABSTRACT

A technique for providing coarse and fine switching on digital-to-analog converter output for a more refined analog output signal. In a digital-to-analog converter utilizing a switched capacitor low-pass filter, the last stage of the filter implements a two phase charging scheme to ensure distortion reduction.

16 Claims, 6 Drawing Sheets

FIG. 6

COARSE/FINE SWITCHING ON DIGITAL-TO-ANALOG CONVERSION OUTPUT

BACKGROUND OF THE INVENTION

1. Field of the Invention

The present invention relates to the field of digital-to-analog conversion and, more particularly, to a technique for providing coarse and fine charging of the output filter capacitor of a digital-to-analog converter in order to provide a more continuous analog output signal.

2. Background of the Related Art

The general technique of providing analog-to-digital (A/D) or digital-to-analog (D/A) conversion of signals is well known in the art. Generally, the sampling rate required to sample an analog signal for A/D conversion must be twice the highest frequency component being sampled. This rate is known as the Nyquist rate. More recently, oversampling methods have been utilized for A/D and D/A conversion. In an oversampling type of converter, the sampling rate is much higher than the Nyquist rate. An oversampling technique is described in a reference titled "Oversampling Methods for A/D and D/A Conversion;" by James C. Candy and Gabor C. Temes; IEEE; pp. 1–25; 1992; and "A use of Double Integration in Sigma Delta Modulation;" by James C. Candy, IEEE Trans. Commun., vol. COM-33, pp. 249–258, March 1985.

An advantage of using the oversampling technique is in the precision provided by the converter. With converters operating under the Nyquist rate for sampling, a certain amount of precision is required for the conversion. For example, in converting an analog signal into a 16-bit digital format, 16-bit precision is required. Accordingly, circuits will need to be designed having components which will meet this precision. In many instances, closely trimmed circuit components or precision matching (or compensating) circuits are required to meet the precision.

However, when sampling at a rate much higher than the required Nyquist sampling rate, the oversampling technique permits circuit precision to be relaxed significantly. For example, if the above A/D 16-bit oversampling converter implements an oversampling modulator, the modulator output can be a single bit output. The circuit precision needs only to meet this 1-bit output. Accordingly, closely trimmed circuit components are generally not needed. Additionally, 1-bit precision can be readily met by current generation CMOS (complementary-metal-oxide-semiconductor) components. This fact also applies to digital-to-analog conversion using an oversampling converter.

The disadvantage of using the oversampling technique is the added requirement that the output now needs to be reduced to the standard Nyquist rate at the eventual output of the converter. That is, the higher sampling rate now needs to be returned to the Nyquist rate. In the above 16-bit A/D example, a multiple number of the 1-bit outputs will need to be combined to form a single 16-bit output, which output is equivalent to the 16-bit output from the Nyquist rate converter. With a D/A converter, such a 16-bit discrete signal is converted to a continuous analog signal. However, the oversampling technique is preferred in many applications, since the cost savings in using less precise circuit components outweigh the additional digital signal processing needed at the back end of the converter.

One well known type of oversampling A/D and D/A conversion uses a modulator commonly referred to as a delta-sigma modulator (See the Candy et al. references noted above). Furthermore, the delta-sigma modulator can be configured as a higher-order modulator having multiple integrator stages. See "A Stereo 16-Bit Delta-Sigma A/D Converter for Digital Audio;" by D. R. Welland et al.; Journal of the Audio Engineering Society, vol. 37, pp. 476–486; June 1989; and "A Higher Order Topology for Interpolative Modulators for Oversampling A/D Converters;" by Kirk C.-H. Chao et al.; IEEE Trans. Circuits and Sys., vol. CAS-37, pp. 309–318; March 1990.

In a D/A converter using a delta-sigma modulator, a digital signal is received for conversion to an analog signal. The digital delta-sigma modulator is clocked at the oversampling rate to generate a bit stream which equates to the oversampled rate. Generally, the output is a bit stream of single bits. Subsequently, this bit stream is processed by one or more D/A converter stages to convert the digital bit stream into an analog signal. Then, typically, the signal is filtered by a low-pass filter to remove the noise.

Converters using delta-sigma modulators typically use switched capacitors coupled to operational amplifiers (op amps) to process the signal. Where the switched capacitor circuits convert analog signals to digital signals or operate to process the digital signals through the various circuit stages, the discrete nature of the signal allows considerable latitude in the settling property of the circuit. For example, non-linear settling responses, signal overshoots, signal jitter and other transients are generally not a concern, since the op amps are switched to a non-processing phase during this period. Thus, these distortion introducing responses are not noted at the output of the various stages.

However, this is not so at the output of the very last stage of a D/A converter. The output node of this last stage is coupled to other circuitry, transmission line, etc, which looks for a continuous analog signal. That is, the output of the last stage of the D/A converter should be a true continuous analog signal. Accordingly, any spurious signals will cause a distortion of the desired analog signal.

The present invention provides for a scheme to reduce distortion at the output of the last stage of a digital-to-analog converter.

SUMMARY OF THE INVENTION

The present invention describes a technique for providing coarse and fine switching on digital-to-analog converter output for a more refined analog output signal. In a digital-to-analog converter utilizing a switched capacitor circuitry, such as a delta-sigma modulator to oversample a digital signal to generate an analog signal, the last stage of the converter typically will use a low-pass filter to remove the quantization noise. When switched capacitor circuits are utilized to provide the filtering, the charging of the filter capacitor by the operational amplifier of the filter stage could introduce transients as the amplifier settles during a recovery phase of the switched circuit. The present invention utilizes two phases of charging, a coarse charging period and a fine charging period, to ensure that the significant stewing of the final filter is controlled during its recovery.

The preferred embodiment utilizes a buffer in the charging circuit to provide the coarse charging of the switched capacitor, so that the operational amplifier of the filter stage need only supply the remaining little charge to charge the capacitor to the desired level. The buffer is removed from the circuit after providing the initial coarse charge, so that its settling and noise properties do not impact the analog output signal.

DETAILED DESCRIPTION OF THE INVENTION

A technique for providing coarse and fine switching at the output of a digital-to-analog converter is described. In the following description, numerous specific details are set forth, such as specific structures, materials, processes, etc., in order to provide a thorough understanding of the present invention. However, it will be appreciated by one skilled in the art that the present invention may be practiced without these specific details. In other instances, well known techniques and structures have not been described in detail in order not to obscure the present invention. It is to be noted that a preferred embodiment of the present invention is described in reference to particular converter using a delta-sigma ($\Delta\Sigma$) modulator. However, it is appreciated that the invention can be readily implemented in various other digital-to-analog converters and is not limited to the embodiment described herein. Furthermore, the invention need not be limited to digital-to-analog converters and can be implemented in many types of amplifier stages as well.

Figure 1:
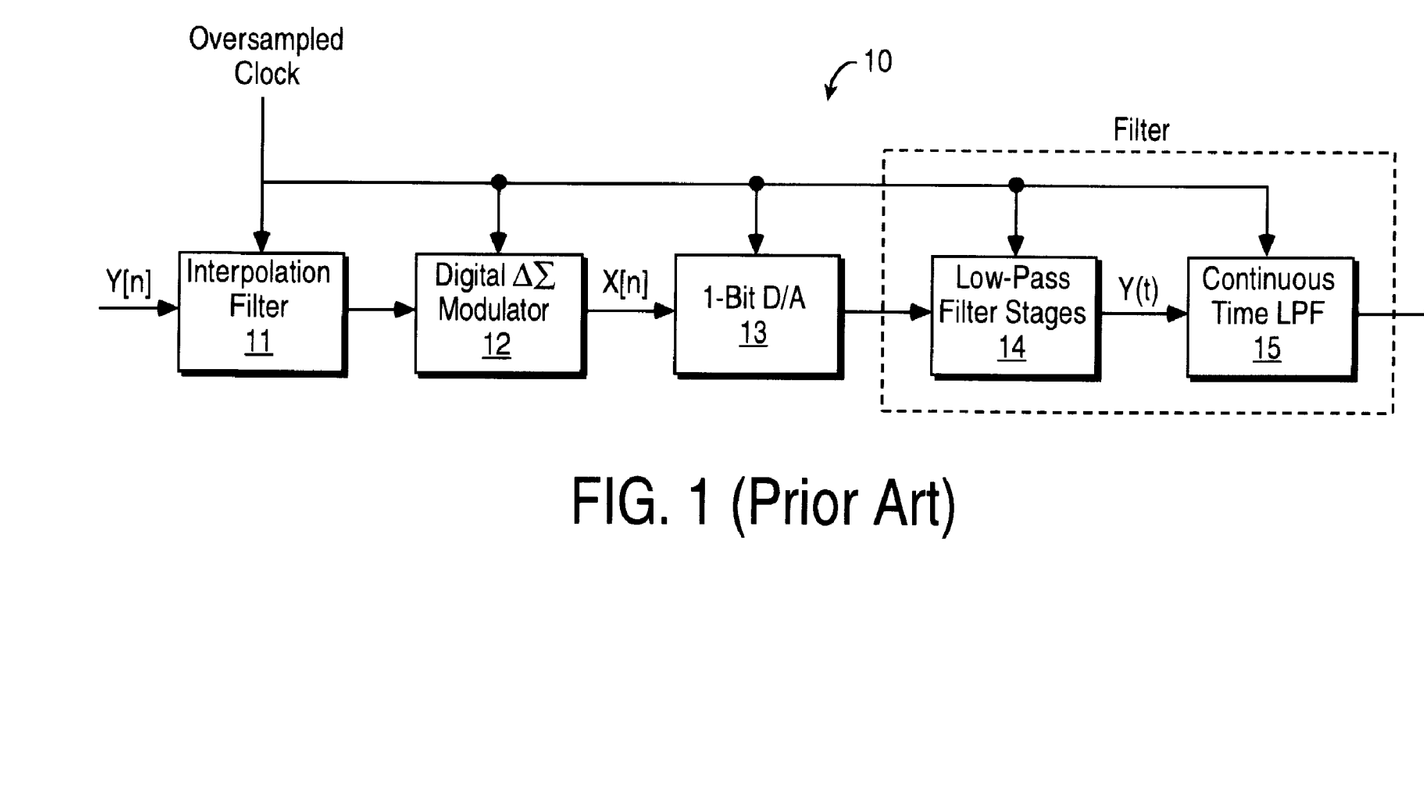
FIG. 1 is a block diagram of a prior art digital-to-analog converter using a delta-sigma modulator and a low-pass filter section which has a final filter stage for providing a continuous (analog) output.

Referring to FIG. 1, a prior art digital-to-analog converter (D/A converter or DAC) 10 is illustrated. The DAC 10 of the preferred embodiment is an oversampling type of DAC, in which an oversampling clock drives a delta-sigma modulator to provide a single bit oversampled output X[n]. An interpolation filter 11 receives a digital signal Y[n] (such as a 16-bit signal) and, after filtering, inputs the digital value into a digital delta-sigma modulator 12. The delta-sigma modulator 12 increases the sampling rate to generate a bit string of 1-bit outputs, which are converted into analog form in a D/A conversion circuit 13. The analog output of the D/A conversion circuit 13 is coupled to one or more stages of a low-pass filter to filter out the higher frequency quantization noise to provide a continuous analog signal Y(t). The quantization noise is introduced by the oversampling at a higher frequency in the delta-sigma modulator and the reduction of the digital input to a 1-bit size.

When switched capacitor circuits are utilized for the filtering function of the analog signal from the D/A conversion circuit 13, more than one switched capacitor stage will typically be utilized. However, it is the last filtering stage that is important in providing a true analog signal Y(t). That is, the last stage of the DAC 10 provides an analog output Y(t) in response to the digital input Y[n]. It is this output which is coupled to other circuitry, wherein the other circuitry will generally respond continuously to whatever signals are present on the output line from the low-pass filter (LPF). Y(t) may also be first coupled to additional continuous time low-pass filter stage(s) 15, if more filtering is required. It is to be noted that the circuitry required to provide the various functions of the blocks shown in FIG. 1 are known in the art.

Figure 2:
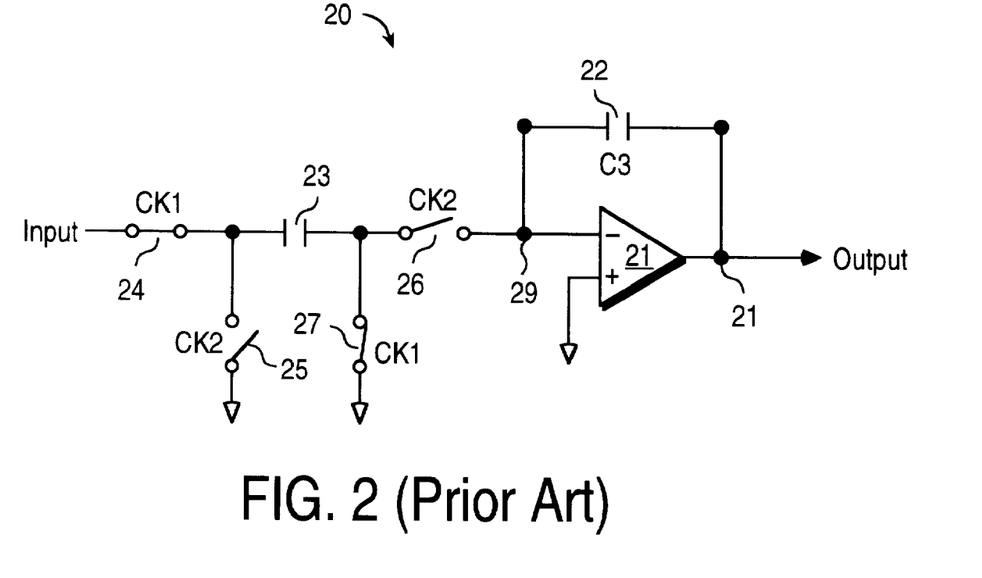
FIG. 2 is a circuit diagram of a typical prior art integrator stage utilizing switched capacitors at an input of an integrator.

A typical prior art switched capacitor integrator circuit 20, which is utilized as a building block for various circuits required for switched capacitor applications, is shown in FIG. 2. For example, the switched capacitor integrator 20 is utilized extensively in a delta-sigma modulator for providing both A/D and D/A conversions. It is also used as a building block for a switched capacitor low-pass filter. The integrator 20 employs a switched capacitor circuitry at an input to an operational amplifier, which functions as an integrator.

As shown, the switched capacitor integrator circuit 20 is comprised of a switched capacitor 23 and switches 24, 25, 26 and 27. This input network is then coupled to an input of an operational amplifier (op amp) 21, which has an integrating capacitor 22 (also noted as C3) coupled in the feedback loop between the output and input of the op amp 21. The switching of an switched capacitor 23 is provided by the switches 24–27. Generally, switches 24 and 27 are closed during one clock pulse (noted as CK1) to have the input signal charge the capacitor 23. During a different clock pulse (noted as CK2), switches 25 and 26 are closed to couple the stored signal to the minus input of the op amp 21. The clock CK2 can be the complement of clock CK1. Typically, the positive input of the op amp 21 is coupled to ground. Node 28 provides the output from the op amp 21, which is then coupled to the next stage or circuit. The operation of this circuit is well known in the art. See for example, the references noted in the Background section above.

Figure 3:
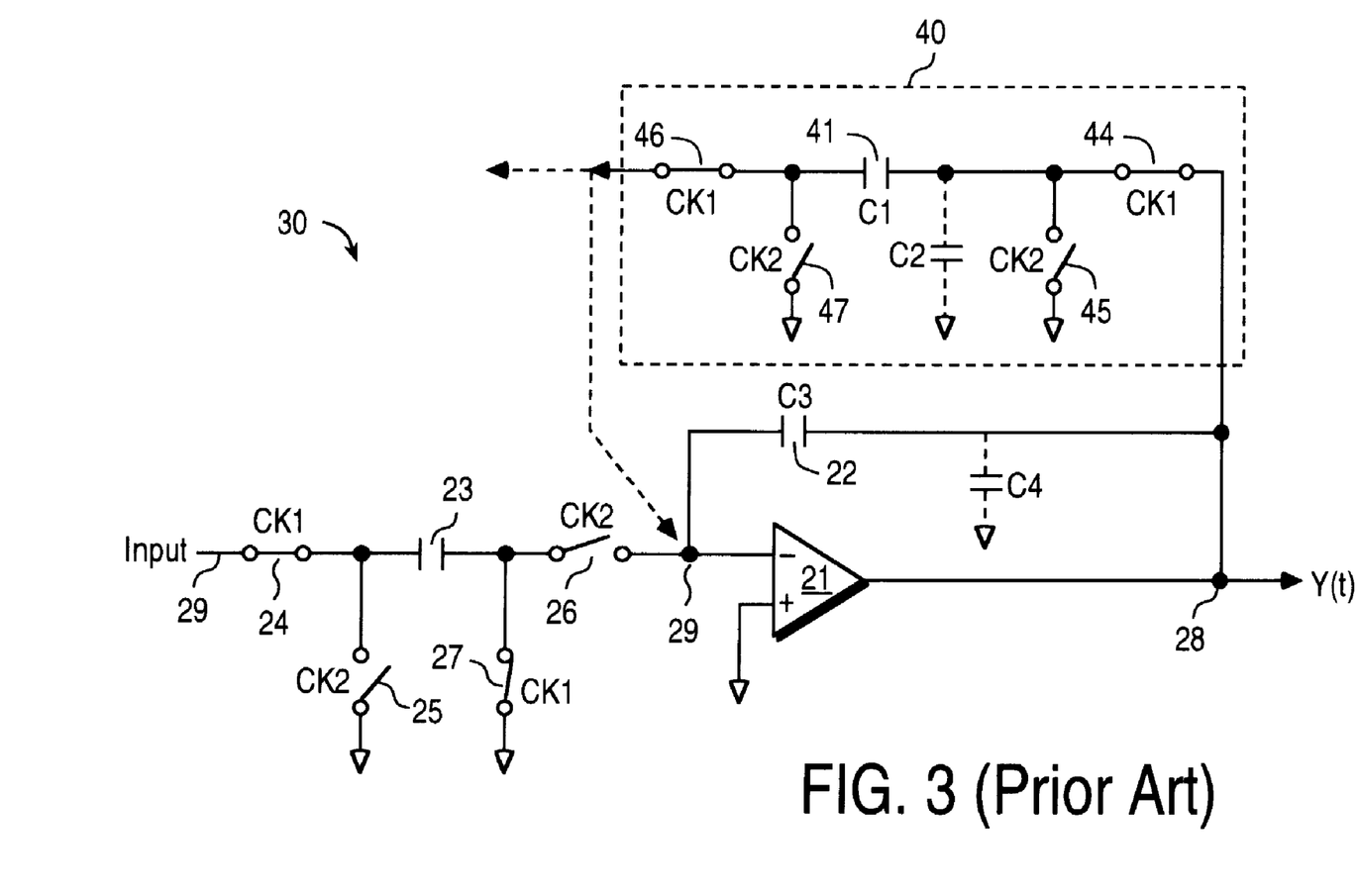
FIG. 3 is circuit diagram of a typical final filter stage of a digital-to-analog converter in which a switched capacitor circuit is used to provide the filtering function to generate a continuous (or analog) output.

Referring to FIG. 3, a switched capacitor low-pass filter circuit 30 typically known in the art is shown. The switched capacitor LPF 30 utilizes the integrator 20 of FIG. 2 with the following additions. A switched capacitor filtering section 40 is coupled to the output node 28. Filtering section 40 is comprised of a switched capacitor 41 (also noted as C1), which is switched by the actions of four switches 44, 45, 46 and 47. The switches 44 and 46 are clocked by CK1, while switches 45 and 47 are clocked by CK2. The switches 44, 46 are coupled in series with the capacitor, so that when these two switches are closed, capacitor C1 is placed into the circuit between the output node 28 and node 49. When switches 45, 47 are closed, each side of the capacitor C1 is coupled to a common terminal, such as ground to discharge the capacitor C1.

The integrator circuit 20 with the addition of the filter section 40 together form the switched-capacitor low-pass filter. Also, as shown, a parasitic capacitance C2 associated with the switched capacitor C1 is shown coupled between one plate of C1 and ground, and a second parasitic capacitor is shown coupled between the one plate of C3 to ground. The presence of C3 and C4 are for the purpose of showing that some parasitic capacitance values enter into the LPF function.

Also to be noted is the connection of node 49 (the other side of switch 46 opposite C1). Node 49 can be coupled back to node 29 (which is at the negative input terminal of the op amp 21) for single stage LPF operation. It can also be coupled back to a similar node 29 of one of the earlier stages of a multi-stage LPF circuit. This configuration is commonly referred to as a bi-quad. The operation of single stage and bi-quad LPF design is known in the art. See for example, Chapter 9 of Design Of MOS VLSI Circuits For Telecommunications titled "Switched-Capacitor Filter Synthesis" by Adel S. Sedra; Prentice-Hall; pp.272–313; 1985; and also Chapter 10 of the same book tiled "Performance Limitations In Switched-Capacitor Filters;" Paul R. Gray and Rinaldo Castello; pp. 314–333.

In the particular instance when the LPF circuit 30 is used as the last filtering stage 15 of a DAC (see FIG. 1) to generate a continuous analog output in response to the conversion of the single-bit bit stream, an added concern arises. As noted earlier, the output Y(t) is viewed as a continuous analog signal by circuitry, transmission line and other devices which are coupled to receive the analog signal. Since the output node 28 is observed continuously, any non-linear settling response (for example, amplifier slewing), signal overshoot, signal jitter and other transients can be noted in the signal y(t). Where these aberrant conditions were not a concern in processing to output digital signals, they are a significant distortion causing concern at this last output stage since node 28 is continuously observed. See for example, the Gray et al. reference note above.

With the circuit of FIG. 3, op amp 21 will need to deliver a charge to C1 and C2, during the phase when switches 44 and 46 are closed. If significant charge current is required, the charging of the capacitance C1 and C2 can cause slewing at the output, which introduces distortion as noted above. The present invention is a technique for preventing transient response in the analog output signal at the output node 28.

Figure 4:
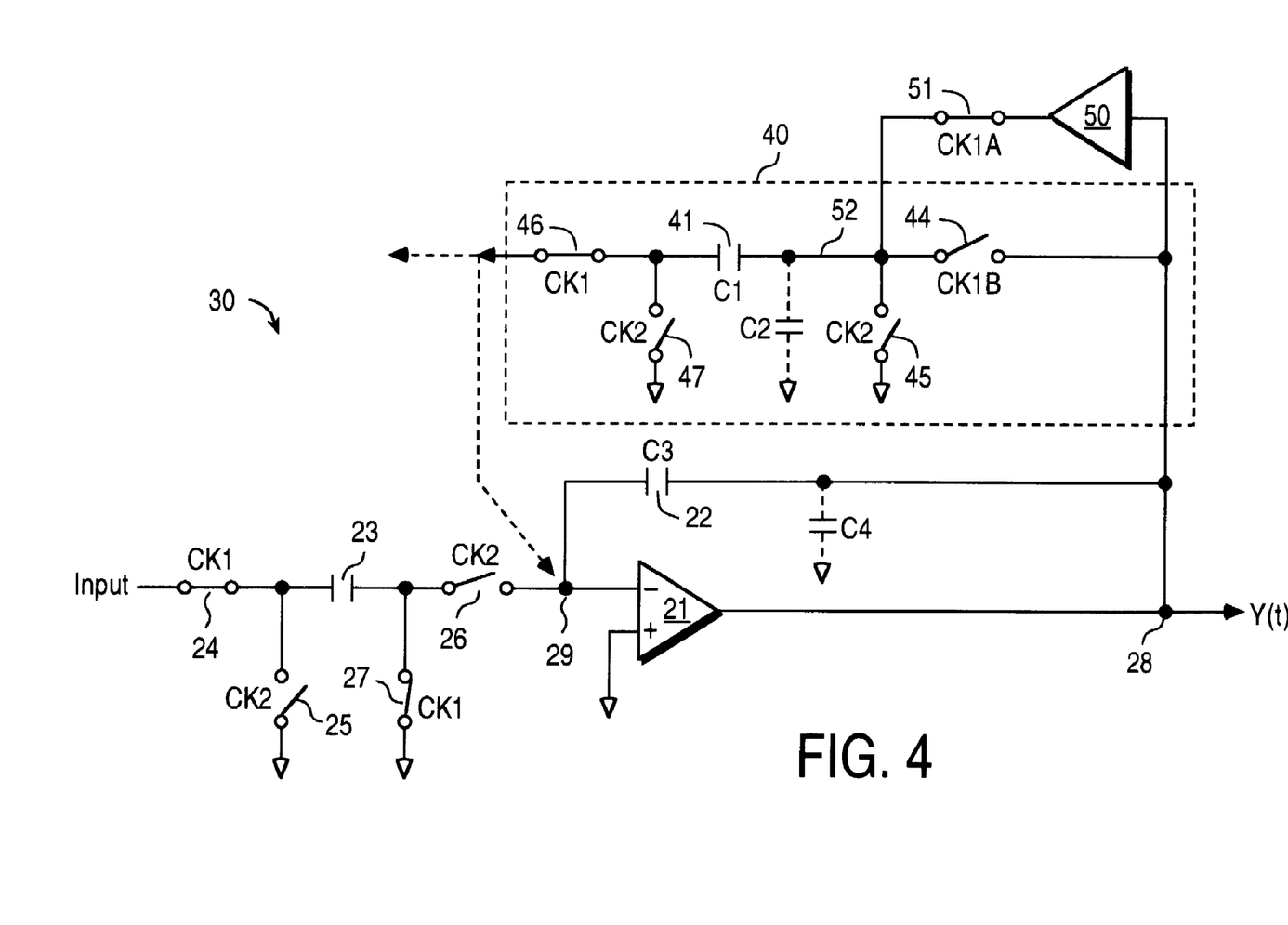
FIG. 4 is circuit diagram of a final stage of a digital-to-analog converter of the present invention in which the low-pass switched capacitor circuit of the filter stage is first coarse charged and then fine charged to provide an improved continuous signal at the output.

Referring to FIG. 4, the circuit 30 of FIG. 3 is repeated, but with the inclusion of the circuit components for practicing the present invention. A buffer 50 and switch 51 are placed across the output node 28 and the junction (shown as node 52) of switches 44 and 45. The switch 51 is disposed at the output of buffer 50, so that when switch 51 is closed buffer 50 is placed into the charging circuit of capacitor C1.

Figure 5:
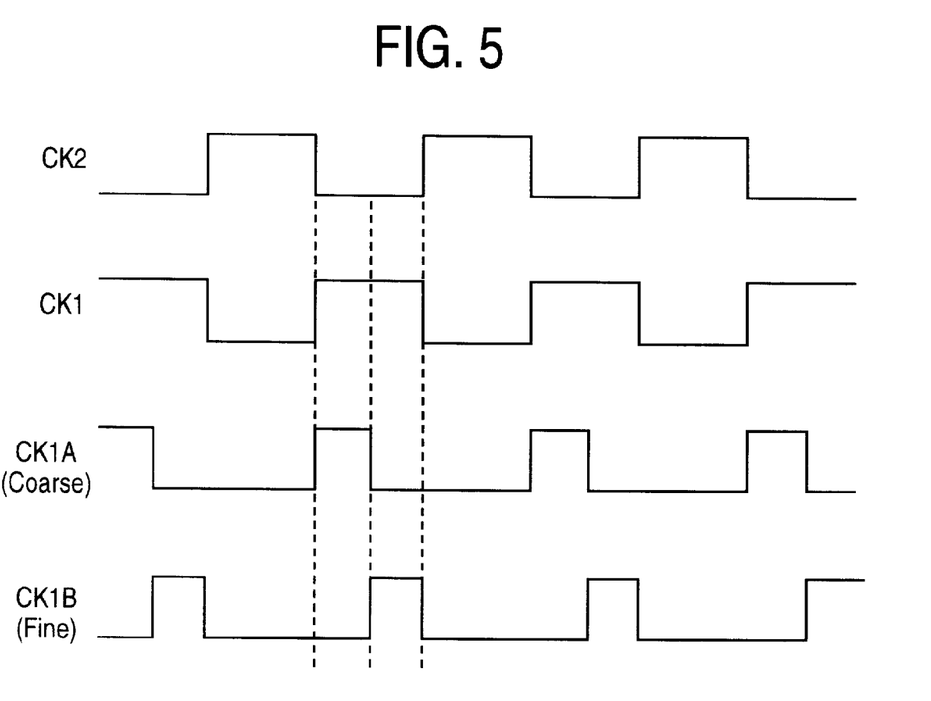
FIG. 5 is a graphic representation of clocking signals for timing the activation of the various switches of the low-pass switched capacitor circuit of FIG. 4.

The clocking signal CK1 is now bifurcated to produce two clocking signals CK1A and CK1B. The switch 46 still is closed by CK1, but the switch 44 is now closed by CK1B. The new switch 51 is closed by CK1A. The timing diagrams of the four clock signals are shown in FIG. 5. As noted, CK1A and CK1B are split from the CK1 signal. The clock signal CK1A occurs at the leading portion of the clock signal CK1, while clock CK1B occurs at the trailing edge of CK1. That is CK1A is activated first and then followed by CK1B. The period of activation of the two switches by CK1A and CK1B is a design choice dependent on the circuit response desired, but generally, CK1A is turned off (switch 51 is in the open position) when CK1B is active (switch 44 is in the closed position).

The closing and opening of the two switches 44 and 51 provide a coarse and fine (coarse/fine) charging of C1 and C2. The buffer 50 provides the initial coarse charging and then op amp 21 provides the final fine charging of C1 and C2. The coarse/fine charging is accomplished as follows for the preferred circuit of FIG. 4. During the initial charging period of C1 and C2, switches 51 and 46 are closed, so that the bulk of the charging function is performed by the buffer 50. This coarse charging attempts to bring the capacitors C1, C2 close to the desired charge value. Subsequently, the switch 51 opens and the switch 44 closes to finish charging the capacitors. Since the capacitors had already been charged to near their desired charge value, this second charging phase provides the remaining (and more fine) charging to bring C1 and C2 to their desired value for the particular output from op amp 21. According, buffer 50 provides the initial coarse charge on C1 and C2, and then the op amp 21 drives C1 and C2 to their final desired value.

This technique removes the large transients at the output, since the op amp 21 need not slew significantly during settling. The large slewing, if any, occurs in the buffer 50. However, the slewing of the output of buffer 50 does not affect the output node 28. Therefore, large recovery swings (slewing) by op amp 21 will be reduced or prevented. Accordingly, waveform shape is better controlled and a more refined and improved analog signal is present at the output of the DAC. It is appreciated that a charge management scheme for controlling the non-linear charge injection of the sampling switches in the input circuit of an analog-to-digital converter is described in U.S. Pat. No. 5,644,257. The present invention is different in that the charging scheme described is used to control the settling behavior of the output stage of a DAC.

Furthermore, with respect to the buffer 50, the requirements placed on it are minimal, since it is out of the circuit during its critical settling period. Accordingly, an op amp buffer can be utilized with minimal requirement. It is appreciated that other devices can be readily inserted in place of buffer 50 to perform the coarse charging of the capacitors. A variety of devices can be adapted to implement the present invention. Furthermore, the present invention need not be limited to the use of a DAC. When implemented in a DAC, the invention can be used in a number of applications.

It is also appreciated that there are a number of ways the present invention can be implemented. For example, in one system implementation, the LPF stage of the present invention is incorporated into a communications circuitry, which includes an isolation barrier.

Figure 6:
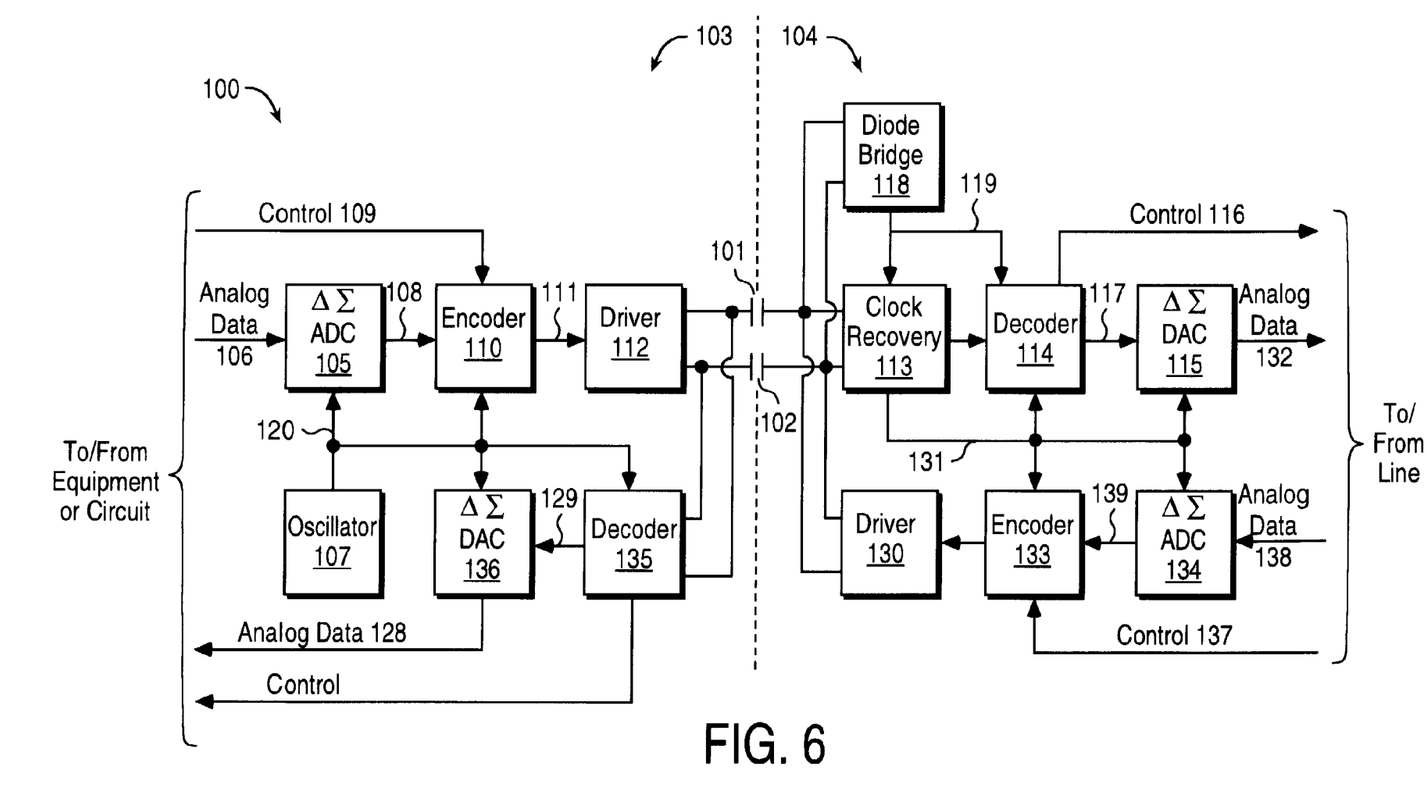
FIG. 6 is a block diagram of an example of an isolation system which incorporates the digital-to-analog converter implementing the present invention.

Referring to FIG. 6, a capacitive isolation system 100, which includes a delta-sigma analog to digital converter implementing the present invention, is shown. The system 100 shown is a bidirectional system allowing data transfer in either direction. In the illustrated example, the capacitive isolation system is separated into a powered side or section 103 (shown to the left of the center dotted line) and a line side or section 104 (shown to the right of the center dotted line). The two sections are separated by the isolation barrier comprised of two high voltage capacitors 101 and 102. Note that the terms "powered" and "line" distinguish the side of the barrier containing AC powered circuitry and the side which is coupled to the communication line, which must be isolated from the powered circuitry or equipment. Isolation of this sort is used in a communication system, such as when AC powered circuitry or equipment is isolated from circuitry interfaced to a telephone line.

The powered section 103 includes a delta-sigma analog-to-digital converter 105 operable on the analog input 106 and synchronized to a clock signal 120 from an oscillator 107. The analog input 106 of the powered section is an analog signal containing information to be transferred across the isolation barrier, which may be for example an analog voice signal to be coupled to a telephone system. Digital output 108 of the delta-sigma ADC 105 may be time-division multiplexed with digital control input 109 by the encoder circuit 110. Digital control input 109 is a digital signal containing additional information to be transferred across the isolation barrier capacitors 101 and 102. The digital control input 109 may include control information for analog circuitry on the line side of the isolation barrier. The encoder circuit 110 also formats the resulting data stream into a coding scheme that allows for robust clock recovery on the line side of the isolation barrier. The encoder circuit 110 also receives the clock signal 120 from the oscillator 107. A driver circuit 112 of the powered section drives the encoded signal to the isolation capacitors 101 and 102 in response to the output 111 of the encoder circuit 110.

In one embodiment, capacitor 101 is driven bidirectionally by drivers 112 and 130 while capacitor 102 provides a return path across the isolation barrier. In another embodiment, capacitors 101 and 102 are differentially driven by digital driver circuits 112 and 130.

An embodiment of the line section, shown to the right of the isolation capacitors includes a clock recovery circuit 113, whose inputs are coupled to the isolation capacitors 101 and 102. The clock recovery circuit 113 recovers a clock signal from the digital data driven across the isolation barrier and provides synchronized clock signal 131 to the various circuits in the line section 104. The recovered clock operates as the time base for a decoder 114 and a delta-sigma digital-to-analog converter 115. The decoder 114 separates the time division multiplexed data and control information, providing digital control output 116 to other circuitry, as well as providing a synchronous data signal 117 as an input to the delta-sigma DAC 115.

The delta-sigma DAC 115, with digital input 117 supplied by the decoder 114, and clock signal 131 supplied by clock recovery unit 113, operates synchronously with the delta-sigma ADC 105 and provides an analog output 132. An active diode bridge 118 is coupled to the isolation capacitors 101 and 102 and supplies a DC power supply voltage to the clock recovery circuit 113 and the decoder 114 by drawing current from the digital signal transferred across the isolation barrier. The driver 130 remains tri-stated until the decoder 114 has detected a valid frame, indicating successful power-up of the line section circuitry.

The embodiment shown in FIG. 6 also enables communication from the line side 104 to the powered side 103, or from right to left across the isolation capacitors as illustrated. An encoder circuit 133 and the driver circuit 130 cooperate to communicate information back from the line side to a decoder circuit 135 in the powered section 103. The encoder 133 receives a clock input 131 from the clock recovery unit 113 and is thereby synchronized to the oscillator 107 and encoder 110. This synchronization allows information transfer in each direction to occur in distinct time slots. In time slots where the driver 112 is operable to transfer information from the powered side 103 to the line side 104, the driver 130 is tri-stated or disabled. Alternatively, in time slots where the line side driver 130 is operable to transfer information back from the line side 104 to the powered side 103, the driver 112 is tri-stated or disabled. In this manner, bidirectional communication may be established across a single pair of high voltage isolation capacitors 101 and 102.

Digital control input 137 of the line section 104 is a digital signal containing information to be communicated across the isolation barrier, including control information for analog circuitry on the powered side of the barrier. The line section 104 also includes a delta-sigma ADC 134 operable on an analog input signal 138, so that the information contained in the analog signal 138 can be conveyed across the barrier in digital form and then accurately reproduced on the powered side 103 of the barrier. The delta-sigma ADC 134 receives its clock input from the clock recovery circuit 113, and is thereby synchronized with the oscillator 107. The digital output signal 139 generated by the ADC 134 may be time-division multiplexed with the digital control input 137 in the encoder 133.

On the powered side 103, the decoder circuit 135 is coupled to the isolation capacitors 101 and 102 to receive signals therefrom and identify signals representing information coming from the line side. The decoder 135 then extracts the digital control information from the data stream received from the line side 104, and passes data signal 129 generated by the delta-sigma ADC 134 to a delta-sigma DAC 136.

The decoder 135 also latches and times the data received across the barrier to synchronize it with the clock signal 120, thereby eliminating the effects of phase noise interference and other sources of jitter in the synchronous digital signal. The clock input from the oscillator 107 ensures to synchronize the ADC 134 to DAC 136. The DAC 136 provides a reconstructed analog data output signal 128, thereby completing the communication of analog information transfer across the isolation barrier.

In summary, FIG. 6 describes a bidirectional communication system for conveying analog and digital information across a capacitive isolation barrier. The barrier itself is inexpensive, since only two high voltage isolation capacitors are required for synchronous, bidirectional communication. The barrier is a reliable communication channel because the digital signals communicated across the barrier are insensitive to amplitude and phase noise interference that may be introduced at the isolation barrier.

The system described above is described in a U.S. Patent Application titled "Isolation System With Digital Communication Across A Capacitive Barrier;" Jeffrey W. Scott et al.; Ser. No. 08/841,409; filed Apr. 22, 1997; which is incorporated by reference herein. It is appreciated that the present invention can be utilized in a ADC in general. The ADC can be configured for use in a variety of systems. The isolation system described above is but one example.

In respect to the scheme of the present invention, it is implemented in the delta-sigma (ΔΣ) DAC 115 in FIG. 6. The invention can also be implemented in the delta-sigma DAC 136. Thus, the use of the present invention in a system's environment is described. As noted, the system's environment is described herein as an example of how a switched capacitor low-pass filter of the present invention can be utilized in a system setting.

Thus, a technique for improving distortion at the output of the last stage of a switched capacitor low-pass filter to provide a more accurate analog output signal from a DAC utilizing a delta-sigma modulator is described. The technique employs a coarse/fine switching scheme at the DAC output.

I claim:

1. In a circuit in which an analog output signal is continuously provided on an output line, an apparatus for reducing an amount of distortion present on the output line comprising:

an amplifier for receiving an input signal and generating the analog output signal;

a capacitor coupled to said amplifier to sample the analog output signal of said amplifier;

a charging circuit coupled to said capacitor for initially charging said capacitor to a value near a desired charging value during a first time period;

said amplifier charging said capacitor a charge remaining to reach the desired charging value during a second time period which follows the first time period.

2. The apparatus of claim 1 further includes a switched capacitor input circuit and said capacitor is also configured as a switched capacitor, wherein said amplifier and capacitor function as a low-pass filter.

3. The apparatus of claim 2 wherein said low-pass filter is a final filter stage for a digital-to-analog converter.

4. In a digital-to-analog conversion circuit in which an analog output signal is continuously provided on an output line, a filter circuit for filtering the analog output signal to reduce an amount of noise present on the output line comprising:

an amplifier for receiving an input signal and generating the analog output signal;

a capacitor coupled to said amplifier to sample the analog output signal of said amplifier;

a charging circuit coupled to said capacitor for initially charging said capacitor to a value near a desired charging value during a first time period;

said amplifier charging said capacitor a charge remaining to reach the desired charging value during a second time period which follows the first time period.

5. The filtering circuit of claim 4 further includes a switched capacitor input circuit and said capacitor is also configured as a switched capacitor, wherein said amplifier and capacitor function as a low-pass switched capacitor filter.

6. The filtering circuit of claim 5 wherein said low-pass filter is a final filter stage for a digital-to-analog converter.

7. The filtering circuit of claim 6 wherein said charging circuit is comprised of a buffer coupled between the output line and said capacitor.

8. The filtering circuit of claim 7 further comprising a switching circuit for switching in said buffer to charge said capacitor, said buffer being driven by said amplifier during the first time period and said switching circuit removing said buffer to couple said amplifier directly to charge said capacitor during the second time period.

9. A method of charging an output line of a filtering circuit coupled to provide a continuous analog output in a digital-to-analog converter, comprising the steps of:

charging a filter capacitor coupled to the output line by a charging circuit coupled to an amplifier during a first time period to initially charge the capacitor to a value near a desired charging value, the analog output signal being generated as an output from the amplifier;

charging the filter capacitor during a second time period following the first time period, in which the amplifier directly charges the capacitor a necessary charge remaining to reach the desired charging value.

10. The method of claim 9 wherein the first charging step provides coarse charging and the second charging step provides fine charging to bring the capacitor to the desired charging value.

11. The method of claim 10 wherein the first charging step includes switching in a buffer to charge the capacitor and the second charging step removes the buffer and directly connects the amplifier to charge the capacitor.

12. A communication system, in which a non-AC powered circuitry is coupled to a transmission medium and in which isolation is required between the non-AC powered circuitry and an AC powered circuitry, for receiving a digital signal from one or the other side of the isolation barrier, converting the digital signal to an analog signal and transferring the analog signal across the isolation barrier comprising:

a capacitive barrier coupled to the AC powered circuitry and non-AC powered circuitry for providing isolation between the two circuitry;

a digital-to-analog conversion circuit in which an analog output signal is continuously provided on an output line, a filter circuit for filtering the analog output signal to reduce an amount of noise present on the output line comprising:

(a) an amplifier for receiving an input signal and generating the analog output signal;

(b) a capacitor coupled to said amplifier to filter the analog output signal of said amplifier;

(c) a charging circuit coupled to said capacitor for initially charging said capacitor to a value near a desired charging value during a first time period;

said amplifier charging said capacitor a charge remaining to reach the desired charging value during a second time period which follows the first time period.

13. The communication system of claim 12 wherein said amplifier includes a switched capacitor input circuit and said capacitor is also configured as a switched capacitor, wherein said amplifier and capacitor function as a low-pass switched capacitor filter.

14. The communication system of claim 13 wherein said low-pass filter is a final filter stage for a digital-to-analog converter.

15. The communication system of claim 14 wherein said charging circuit is comprised of a buffer coupled between the output line and said capacitor.

16. The communication system of claim 15 further comprising a switching circuit for switching in said buffer to charge said capacitor, said buffer being driven by said amplifier during the first time period and said switching circuit removing said buffer to couple said amplifier directly to charge said capacitor during the second time period.

* * * * *